(12) United States Patent
Sumiyoshi

(10) Patent No.: US 7,233,638 B2
(45) Date of Patent: Jun. 19, 2007

(54) SAMPLING CLOCK GENERATOR CIRCUIT AND DATA RECEIVER USING THE SAME

(75) Inventor: Nobuya Sumiyoshi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1340 days.

(21) Appl. No.: 10/054,964

(22) Filed: Jan. 25, 2002

(65) Prior Publication Data

US 2002/0101947 A1 Aug. 1, 2002

(30) Foreign Application Priority Data

Jan. 31, 2001 (JP) ............................. 2001-023467

(51) Int. Cl.
*H03D 3/24* (2006.01)
(52) U.S. Cl. ...................... 375/376; 375/373; 331/57
(58) Field of Classification Search ................ 375/376, 375/373; 331/57
See application file for complete search history.

(56) References Cited

U.S. PATENT DOCUMENTS 5,239,274 A * 8/1993 Chi .............................. 331/57

6,683,503 B2 * 1/2004 Mizuno et al. ............... 331/46

FOREIGN PATENT DOCUMENTS

JP 4-20016 1/1992

* cited by examiner

*Primary Examiner*—Temesghen Ghebretinsae
*Assistant Examiner*—Juan Alberto Torres
(74) *Attorney, Agent, or Firm*—Mattingly, Stanger, Malur & Brundidge, P.C.

(57) ABSTRACT

A sampling clock generator circuit comprises a ring oscillator including series-connected m first inverters connected to a first power supply line, where m is an odd number equal to or larger than 3, a delay line including series-connected 2m or 2m−1 second inverters connected to a second power supply line, for delaying an externally supplied clock, and a PLL circuit for controlling an oscillation frequency of the ring oscillator by controlling a voltage of the first power supply line by using the ring oscillator as a voltage controlled oscillation circuit. A voltage of the second power supply line is set substantially equal to the voltage of the first power supply line and the delayed clock obtained by the second inverters is used as a sampling clock.

12 Claims, 4 Drawing Sheets

SAMPLING CLOCK GENERATOR CIRCUIT AND DATA RECEIVER USING THE SAME

BACKGROUND OF THE INVENTION

1. Field of the Invention

The present invention relates to a sampling clock generator circuit and a data receiver using the same circuit for use in a transmission system in which data is serially transmitted in units of n data at a frequency, which is n times a frequency of a transmitting clock signal, on a transmitting side, and converted into parallel data by using n sampling clock pulses on a receiving side as a receiving data, where n is an integer equal to or larger than 2, and a data receiving device using the same sampling clock generator circuit. In particular, the present invention relates to a sampling clock generator for generating a sampling clock signal with which a data sampling miss due to jitter of the external clock can be prevented, and a data receiving device using the sampling clock generator circuit.

2. Prior Art

It has been usual that, when data is transmitted from a personal computer to a peripheral unit, the data is serially transmitted together with a clock signal at high speed. In the serial data transmission system, a transmitting side transmits data serially in units of n data at a frequency, which is n times that of the clock CLK or with a period, which is one n-th of a period of the clock signal on the transmitting side, and a receiving side receives the clock signal having period n times that of the data as an external clock (a transmitting clock signal) together with the data and generates a sampling clock pulses the number of which is n times that of the clock signal on the transmitting side to convert the serial data transmitted in units of n data into a parallel data in units of n data on the basis of the n sampling clock pulses. Incidentally, n is an integer equal to or larger than 2.

A high speed transmission system of this kind is used in a data transmission from a personal computer, for example, to a color printer or a color liquid crystal display, a transmission within a digital TV or a set top box, etc., for example, and a data transmission in various communication equipments or in peripheral equipments of a computer. In order to receive the transmitted external clock CLK and output n data in parallel on the receiving side, the data receiving side generates sampling clock signal having frequency, which is n times that of the external clock CLK, by PLL control on the basis of the external clock CLK. Therefore, a sampling clock generator circuit of PLL control type is provided on the receiving side.

In such case, in order to restrict skew or jitter of the data and the clock during transmission thereof as small as possible, the sampling clock signal CLK having frequency, which is n times that of the external clock CLK, and generated in the receiving side is not obtained directly from an oscillator circuit oscillating at that frequency. That is, n clock pulses CK each having a period T, which is the same as the period T of the external clock CLK, and having phases mutually deviated are generated such that sampling clock pulses CK are located in centers of sub periods T/n obtained by dividing the period T of the external clock signal CLK by n. In other words, the sampling clock generator circuit generates n clocks CK including a first one of them having phase deviated from the data period T by T/2n and a second and subsequent clocks CK having phases deviated from directly preceding clocks by +T/n, respectively, and the rising edges of the n clock pulses CK are used as a sampling clock signal having frequency n times that of the external clock CLK. Therefore, the high frequency sampling clock signal can be obtained with precise timing on the receiving side.

Similarly, the transmission of the external clock signal CLK and the transmission of the data are performed simultaneously by transmitting each of them as positive and negative phase signal data through two lines having phase difference of 180°. In order to achieve this transmission, LVDS (Low Voltage Differential Signalling) system is used, in which signals having two phases are transmitted by a differentially operating transmitting/receiving buffer circuit.

A digital color liquid crystal display device is an example, which uses this system. In the digital liquid crystal display device, data is serially transmitted in units of 7 (n=7) data at a speed 7 (n=7) times a transmission speed of the external clock signal CLK transmitted from the computer and the data thus transmitted is outputted in parallel on the receiving side.

The sampling clock generator circuit for generating a sampling clock signal having frequency n times that of the external clock signal CLK on the receiving side in this case takes in the form of a PLL circuit utilizing a ring oscillator as a VCO (voltage controlled oscillator) as shown in FIG. 4. Outputs of n stages (when n is an even integer, n+1 stages) of the ring oscillator are derived as the sampling clocks.

In concrete, the sampling clock generator circuit 1 in the form of the PLL control circuit includes a phase comparator 2, a charge pump circuit 3, a low-pass filter (LPF) 4 and an ring oscillator 5 having series-connected 7 inverters, as shown in FIG. 4. The charge pump circuit 3 receives the output of the phase comparator 2 and an output current of the charge pump circuit 3 is inputted to the low-pass filter (LPF) 4.

In the sampling clock generator circuit 1 using the ring oscillator 5 as the VCO, an output voltage of the low-pass filter 4 for generating an oscillation control voltage is inputted to a voltage follower and an output of the voltage follower is supplied to a power source line for the odd number of inverters of the ring oscillator to drive them. An output of the inverter in the last stage of the ring oscillator is fedback to an input of the inverter in the first stage. Thus, the operating currents of the respective inverters are controlled according to the output voltage of the LPF 4 to control the oscillation frequency of the ring oscillator.

The external clock signal CLK, which is transmitted from the computer as the transmitting side through a transmission circuit 9 and has a period T, is inputted to the phase comparator 2 and n (n=7) clock pulses CK are derived from the inverters in the odd numbered stage of the ring oscillator 5 in synchronism with the external clock signal CLK. Therefore, the ring oscillator 5 is composed of series-connected 7 inverters.

The n (=7) clock pulses CK obtained by the ring oscillator 5 are sent to a serial/parallel converter circuit 6 as a sampling clock to sample three data corresponding to R, G and B, which are supplied serially from the data receiving circuit 7 to the serial/parallel converter circuit 6. The serial/parallel converter circuit 6 converts the R, G and B data into a parallel data in units of n (=7) data at a rate, which is n (=7) times the data transmission rate. The parallel data is supplied to a controller 8.

Incidentally, a reference numeral 10a depicts data lines between the transmitting circuit 9 on the computer side and the receiving circuit 7 on the liquid crystal display side and a reference numeral 10b depicts the transmission lines for the external clock signal CLK between the transmitting circuit 9 on the computer side and the receiving circuit 7 on the liquid crystal display side. The transmission and the receiving in this case is performed by transmission and receiving of the respective data and the external clock signal CLK using the LVDS system through two signals having phase difference of 180° obtained by a differential amplifier 5 as a driver.

The sampling clock pulses CK outputted from the ring oscillator 5 are derived from the odd-numbered inverter stages and the phase of the sampling clock pulse CK of the first inverter stage is shifted from the external clock signal CLK by T/2n (2n=14), where T is the period of the external clock signal CLK, and the phases of the sampling clock pulses CK from the subsequent odd-numbered inverter stages are shifted by +T/n (n=7) from immediately preceding inverter stages, respectively, as shown in FIG. 5. In a case, the sampling clock pulse CK of the second inverter stage becomes the sampling clock pulse CK of the ninth inverter stage, the sampling clock pulse CK of the forth inverter stage becomes the sampling clock pulse CK of the eleven inverter stage and the sampling clock pulse CK of the sixth inverter stage becomes the sampling clock pulse CK of the thirteenth inverter stage.

The rising edges of these clocks CK become sampling timing of the data. In this manner, when data is to be transmitted at a frequency n times that of the external clock signal CLK, rising or falling edges of the n clock pulses CK are used as sampling clocks having frequency equivalent to n times that of the received external clock signal CLK.

In a case where XGA (1024×768) display is performed by the liquid crystal display device, however, the period of the external clock signal CLK is limited to the order of 15.38 nano sec (≈65 MHz) and the period of data transmitted at a rate n times that of the external clock signal CLK is as short as 2.20 nano sec (≈455 MHz). Therefore, if there is jitter in the external clock signal CLK transmitted through a cable, a deviation in phase between the transmitted data and the transmitted clock becomes large, so that a period in which the rising and falling of the data becomes uncertain is shifted, resulting in that a range in which data sampling can be done becomes 1 nano second or shorter. Therefore, even when sampling clocks at a speed n times that of the external clock signal CLK can be generated by PLL control, there is a problem that a highly precise data receiving can not be done.

An example of the timing problem due to jitter is shown in an ellipsoidal area in FIG. 5. As shown in FIG. 5, the rising edges of the respective clocks CK, which are PLL-controlled, do not correspond to the rising edge of the external clock signal CLK. Therefore, if the external clock signal CLK is delayed, the rising edges of the clocks CK are advanced with respect to the rising edge of the external clock signal CLK, so that it becomes impossible to sample the data, which is synchronized with the external clock signal CLK and has a frequency n times that of the external clock signal CLK, that is, a period of one n-th of the period of the external clock signal CLK.

SUMMARY OF THE INVENTION

An object of the present invention is to solve this problem of the conventional technique by providing a sampling clock generator circuit generating data sampling clocks, which is capable of preventing data sampling miss due to jitter of a transmitted external clock signal.

Another object of the present invention is to provide a data receiving device capable of preventing data sampling miss due to jitter of a transmitted external clock signal.

In order to achieve these objects of the present invention, a sampling clock generator circuit according to the present invention is featured by comprising a ring oscillator including series-connected m first inverters connected to a first power supply line, where m is an odd integer equal to or larger than 3, a delay line including series-connected 2 m or 2 m−1 second inverters connected to a second power supply line, for delaying an externally supplied clock and a PLL circuit for controlling an oscillation frequency of the ring oscillator by controlling a voltage of the first power supply line by using the ring oscillator as a voltage controlled oscillation circuit, wherein a voltage of the second power supply line is set substantially equal to the voltage of the first power supply line and the delayed clocks obtained by the second inverters are used as a sampling clock signal.

A data receiving device according to the present invention is featured by comprising a ring oscillator including series-connected m first inverters connected to a first power supply line, where m is an odd integer equal to or larger than 3, a delay line including series-connected 2 m or 2 m−1 second inverters connected to a second power supply line, for delaying an externally supplied clock and a PLL circuit for controlling an oscillation frequency of the ring oscillator by controlling a voltage of the first power supply line by using the ring oscillator as a voltage controlled oscillation circuit, wherein a voltage of the second power supply line is set substantially equal to the voltage of the first power supply line and the delayed clocks obtained by the second inverters are used as a sampling clock signal and a serial/parallel converter circuit for converting the transmitted serial data into parallel data in units of n serial data by utilizing rising or falling edges of n clocks each having a period of one n-th of the period of the external clock, which are supplied from the second inverters constituting the delay line, where n is an integer equal to or larger than 2.

As mentioned, in the present invention, the delay line having substantially the same structure as that of the ring oscillator and including series-connected inverters the number of which is substantially twice the number of the inverters of the ring oscillator is provided to control delay times of the respective inverters of the delay line substantially equally and the ring oscillator oscillating at a reference frequency equal to the frequency of the external clock signal CLK is provided. The sampling clocks is generated by generating delayed clocks synchronized with the external clock signal CLK by delaying the latter in concomitant with jitter thereof by the delay line.

In this case, since the power source lines of the inverters constituting the ring oscillator and the inverters constituting the delay line are controlled such that voltages of the power source lines become substantially equal, the delay time of the inverters of the delay line is also PLL controlled. Further, since the external clock CLK is inputted to the delay line, it is possible to generate the sampling clocks with direct reference to the external clock CLK. As a result, even if the external clock includes jitter, the data sampling miss hardly occurs in the parallel/serial conversion in the data receiving device.

Incidentally, a conventional data delay circuit including series-connected m inverters disclosed in U.S. Pat. No. 6,333,652 (JP 2000-341099A) which is assigned to the assignee of the present application.

DETAILED DESCRIPTION OF THE PREFERRED EMBODIMENTS

Embodiments of the present invention will be described in detail with reference to the drawings. It should be noted that, in these embodiments, m is generally an odd integer equal to or larger than 3, which indicates the number of inverters constituting a ring oscillator or a delay line and, in the embodiments, m=n=7. The n is an integer equal to or larger than 2 and is equal to or less than m and indicates a multiple of transmission speed with respect to a transmission speed of a external clock signal.

Figure 1:
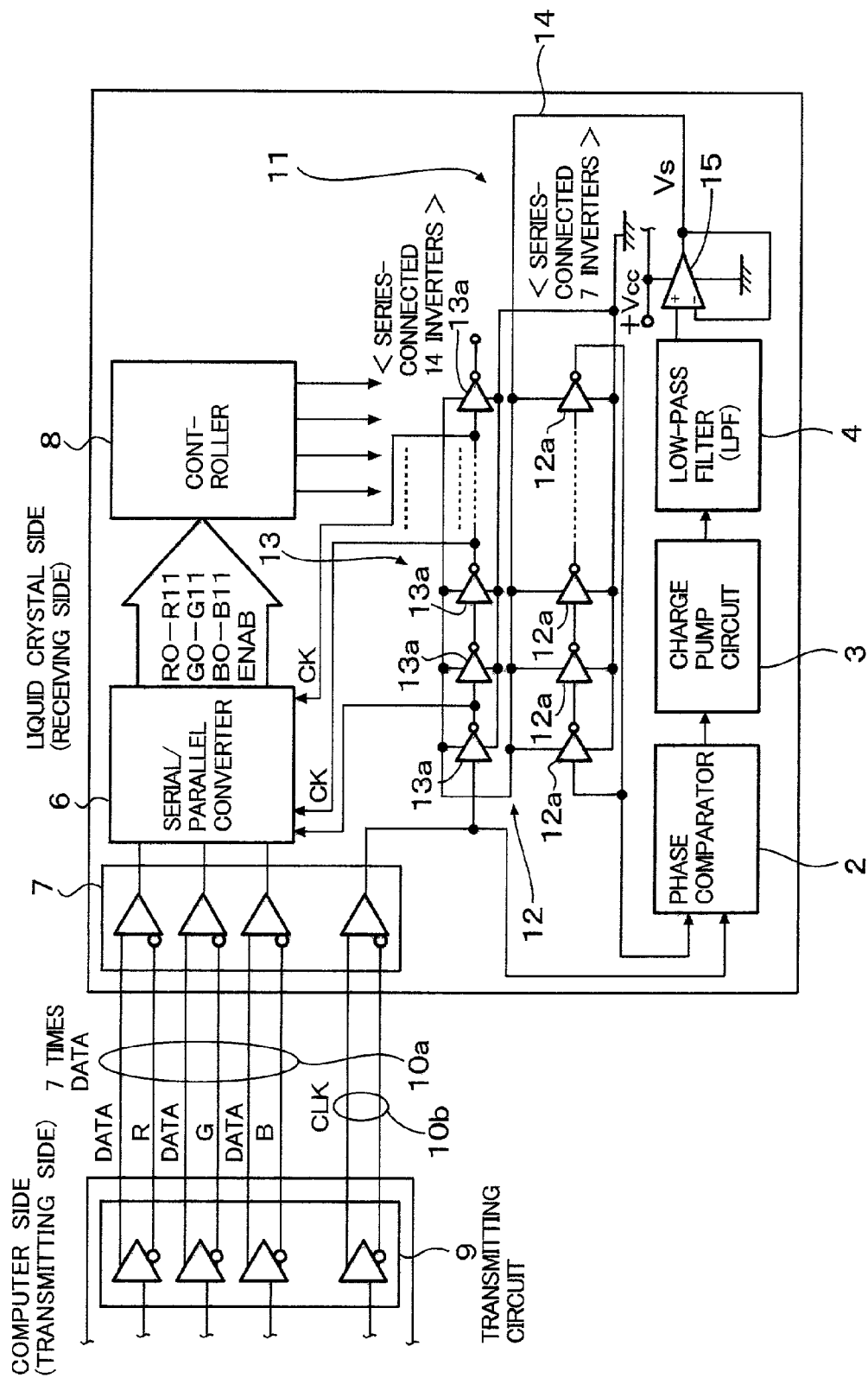
FIG. 1 is a block circuit diagram of a liquid crystal display device of an embodiment to which a sampling clock generator circuit of the present invention is applied.

In FIG. 1, which is a circuit construction of a data transmission system according to a first embodiment of the present invention, the data transmission system has a transmitting side (computer side) including a transmitting circuit 9 and a receiving side (liquid crystal device). The receiving side includes a serial-parallel converter 6, a data receiving circuit 7, a controller 8, a sampling clock generator circuit 11 in the form of a PLL control circuit including a phase comparator 2, a charge pump 3, a low-pass filter 4, a voltage follower 15, which is responsive to an output of a low-pass filter (LPF) 4 to generate a control voltage $V_s$, and a ring oscillator 12 composed of 2 m series-connected inverters 12a and a delay line 13 for delaying a received external clock signal CLK, which is composed of 2 m inverters 13a. The control voltage is applied to a power supply line 14 connected to the inverters 12a and 13a. Thus, an oscillation frequency of the ring oscillator 12 is PLL-controlled such that it coincident with a frequency of the external clock signal CLK.

Figure 4:
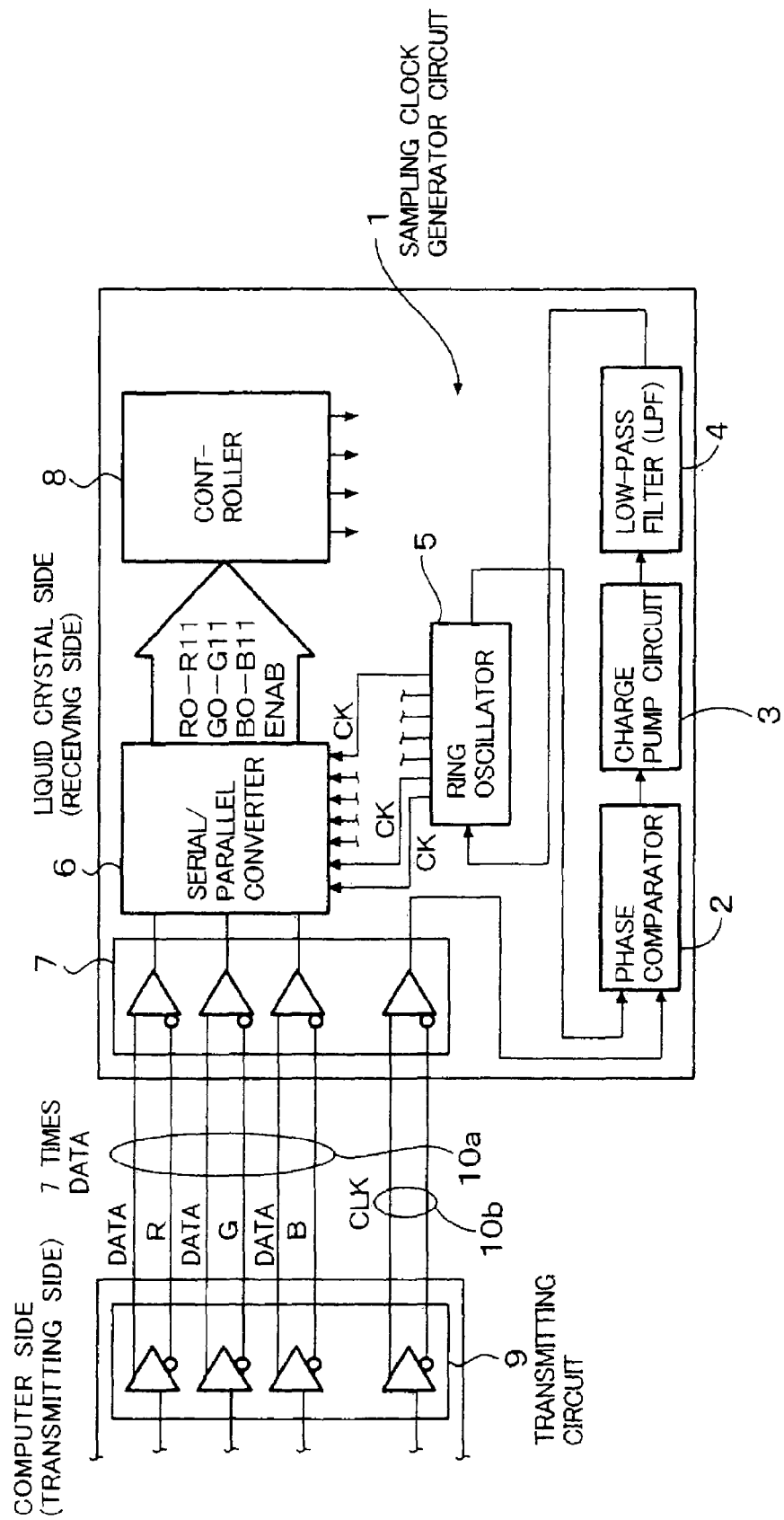
FIG. 4 is a block circuit diagram of a conventional liquid crystal display device for generating of another embodiment to which a sampling clock generator circuit of the present invention is applied.

Incidentally, detailed description of the components other than the sampling clock generator 11, the ring oscillator 12, the delay line 13 and the voltage follower 15, which are the same as those shown in FIG. 4 and are depicted by the same reference numerals, is omitted for avoidance of duplication.

Each of the inverters 12a constituting the ring oscillator 12 and each of the inverters 13a of the delay line 13 have the same characteristics, so that the delay time of the inverters 13a of the delay line 3 is also PLL-controlled such that it becomes equal to that of the inverters 12a.

Since outputs of the odd-numbered inverters of the ring oscillator 12 are utilized as shown, the inverter 13a in the last stage of the delay line 13 is unnecessary. Therefore, the number of the inverters 13a of the delay line 13 may be (2 m−1). The reason for the provision of 2 m inverters 13a is that an output of the inverter 13a in the last stage may be utilized for some other purpose.

Figure 2:
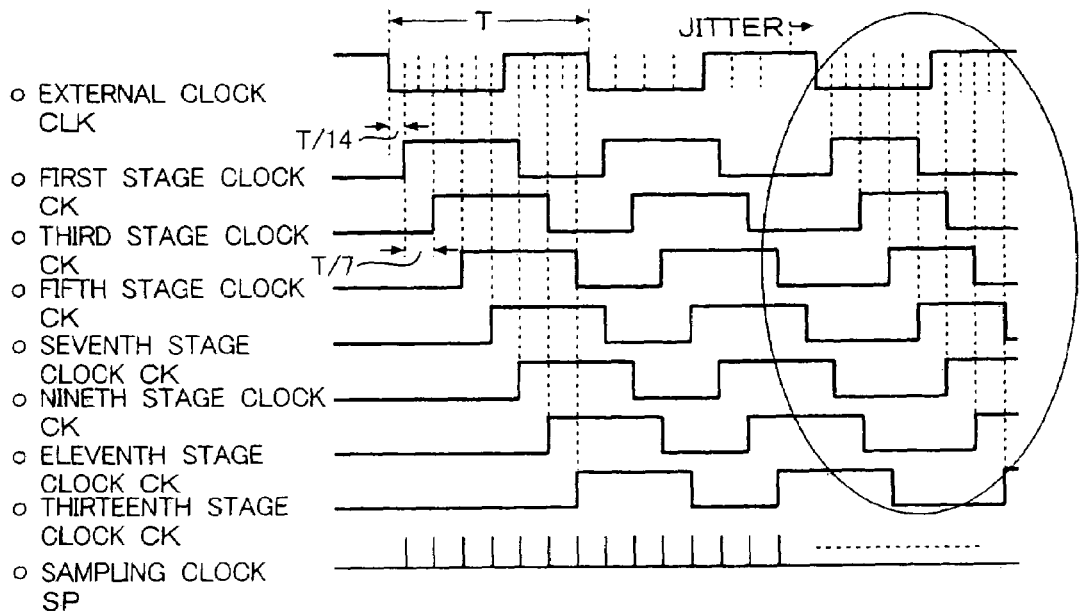
FIG. 2 shows waveforms of the sampling clock.
Figure 5:
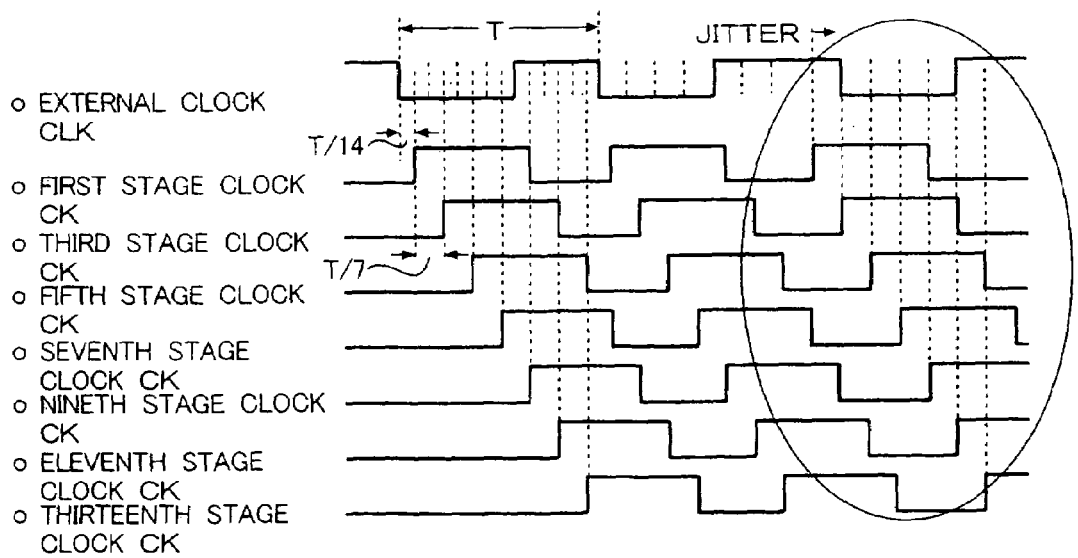
FIG. 5 shows waveforms of the sampling clock generated by the sampling clock generator circuit shown in FIG. 4.

Incidentally, in order to set a timing point (rising edge of the clock CK from the first inverter stage of the delay line 13 in a center position of a T/m, which a period T of the external clock signal CLK divided by m as shown in FIG. 2, the delay time of the inverter 13a in the first stage has to be shifted by T/2 m, which corresponds to the delay time of one inverter 13a, from a timing position (falling edge) of the period T of the external clock signal CLK. On the other hand, in the ring oscillator 12 and the delay line 13, each inverter 12a and each inverter 13a operate to generate A.C. voltage by switching D.C. voltage. Therefore, a pulse having the same rising and falling edges at an output of every other inverter 12a and at an output of every other inverter 13a. Since the oscillation frequency of the ring oscillator 12 of the m inverters 12a becomes 1/T (period T according to the period T of the external clock signal CLK, representing the delay time of one inverter 12a by k and making the rising edge or falling edge thereof correspondent to the falling edge or rising of the external clock signal CLK, k becomes T/2 m. Therefore, an operating delay time of each of the inverters 12a and 13a becomes T/2 m.

In view of this, the delay line 13 is constructed with the 2 m (or 2 m−1) inverters to shift delay times of the respective inverters 13a by T/2 m, which corresponds to an operating delay of one inverter 12a of the ring oscillator 12, to thereby obtain the clocks CK from the odd-numbered inverters 12a as shown in FIG. 2. A sampling clock signal SP as shown in FIG. 2 is obtained by using the rising edges of the clocks CK according to the falling edge of the external clock signal CLK.

Each clock pulse of the sampling clock signal SP is generated at a center position of a period T/m, which is the period T of the external clock signal CLK divided by the number m (=7) of the inverters 12a of the ring oscillator 12.

Therefore, the period of the clock pulses CK generated by the delay line 13 become T corresponding to that of the external clock signal CLK and the clock pulses are PLL-controlled as mentioned. The sampling clock generator circuit 11 can generate the sampling clock signal SP having higher frequency than that of the external clock signal CLK at the rising or falling edges of the m clock pulses CK with high precision. Further, since the clock pulses derived from the odd-numbered inverters 13a of the delay line 13 are obtained by delaying the external clock CLK, the clock signal CK reflects a phase deviation such as jitter of the external clock CLK, directly.

The sampling clock pulses CK may include jitter, which corresponds to jitter of the received external clock CLK as shown in an ellipsoidal area in FIG. 2 and, in the case when the clock frequency is n times the external clock signal frequency, the rising edges of the sampling clocks CK is set in substantially the center positions of the partial periods each being T/n, regardless of generation of jitter.

Therefore, it is possible to provide a wider range in which the embodiment can follow jitter.

Figure 3:
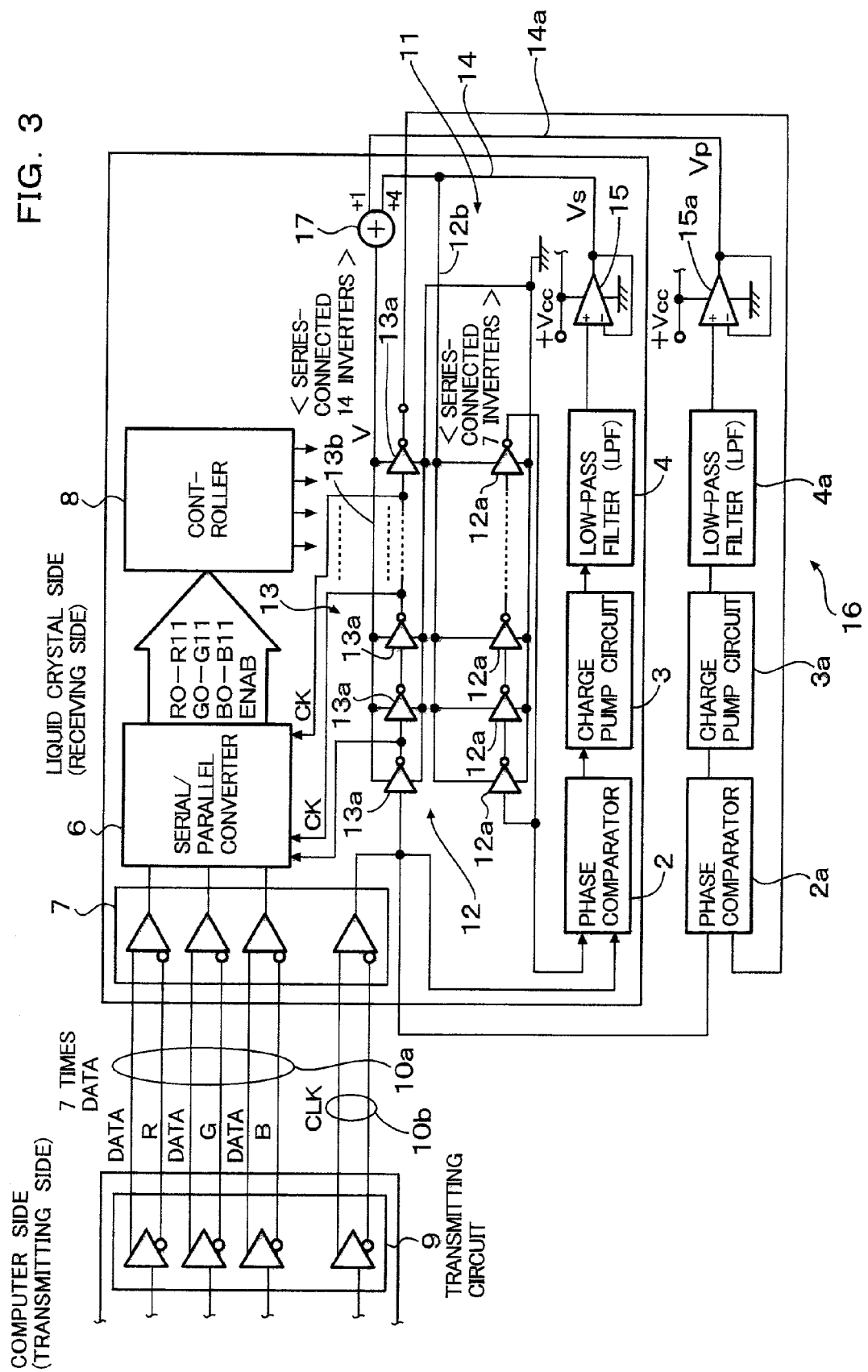
FIG. 3 is a block circuit diagram of a liquid crystal display device of another embodiment to which a sampling clock generator circuit of the present invention is applied.

FIG. 3 shows another embodiment of the present invention in which characteristics variation of inverter elements during manufacture thereof is restricted to make the regulation of frequency of the clock CK unnecessary.

It should be noted that, in the embodiment shown in FIG. 1, the oscillation frequency of the ring oscillator 12 is PLL-controlled and the control voltage thereof is used as the power source voltage of the inverters 12a of the ring oscillator 12 and, simultaneously, of the inverters 13a of the delay line 13.

As a result, the voltage of the power source line connected to a certain number of inverters is controlled by inverters the number of which is one third of the inverters connected to the power source line. Therefore, there may be a problem that the delay time of the delay line 13 can not be controlled by only the PLL controlled ring oscillator 12 if there is variation of characteristics of the inverter elements of the delay line 13.

This is due to the variation of characteristics (operating times) of the inverter elements, there may be a case where delay time of several percent of the inverter elements must be finely regulated.

In the embodiment shown in FIG. 3 in order to avoid such problem, a power source line for a ring oscillator 12 is separated from a power source line for a delay line 13 and control voltages for the power source lines are generated separately. In FIG. 3, a voltage $V_S$ of the power source line of the ring oscillator 12 is mainly used and a voltage, which influences the characteristics of the delay line 13, is obtained from a control voltage $V_p$ of the delay line as a correcting voltage for correcting the voltage $V_s$ of the power source line of the ring oscillator 12. The corrected voltage is used as a voltage of a power source line 13b of the delay line 13. Therefore, it is possible to make the regulation of the frequency of the clock CK unnecessary.

In FIG. 3, a power source line 12b of the ring oscillator 12 and the power source line 13b of the delay line 13 are separated each other.

A phase comparator circuit 2a corresponds to the phase comparator circuit 2 shown in FIG. 1 and compares phase of an external clock CLK generated at 2 m-th stage of the delay line 13 with phase of the external clock CLK at the input of the delay line 13. A signal resultant from the comparison is supplied to a charge pump 3a. The charge pump 3a, a low-pass filter 4a and a voltage follower 15a correspond to the charge pump 3, the low-pass filter 4 and the voltage follower 15 shown in FIG. 1, respectively. These components together with the ring oscillator 12 constitute a PLL circuit 16 for the delay line 13. The voltage follower 15a of the PLL circuit 16 generates the control voltage signal $V_p$ for locking the phase of the clock CK outputted from the delay line 13 to the phase of the input external clock signal CLK and supplies the control signal to the line 14a.

In this case, the voltage for producing a correct delay time is generated on the power source line 13b. Therefore, if the delay times of the inverters 13a are correct, the phase of the input side clock has to coincide with the phase of the output side clock, which is delayed by 360°, since the number of the inverters 13a is 2 m (=14). When the phases of these clocks are not coincident with each other, the phase error is caused by mainly a variation of the characteristics of the inverters 13a of the delay line 13.

In this embodiment, the phase of the input side external clock CLK is compared with the phase of the output side external clock CLK and the control voltage signal $V_p$ for correcting the phase error is generated by the voltage follower 15a. The control voltage signal $V_p$ for correcting the phase error is supplied to a synthesizing circuit 17 in which it is synthesized with the voltage $V_s$ generated by the voltage follower 15.

The synthesizing circuit 17 synthesizes the control voltage signal $V_p$ of the voltage follower 15a with the voltage $V_s$ generated by the voltage follower 15 in a predetermined ratio, 1:4, for example, to generate the voltage V of the power source line 13b.

For example, it is assumed that a normal delay time of each of the inverters 12a and 13a is k=T/2 m, the output voltage $V_p$ of the voltage follower 15a is 5V and the output voltage $V_s$ of the voltage follower 15 is 5V. In such case, the synthesizing circuit 17 generates V1+V2=5.0V, where V1=$V_s$×0.8=5.0×0.8 and V2=$V_p$×0.2=5.0V×0.2. When the voltage $V_s$ for making the input side external clock CLK and the output side external clock CLK in phase is 6.0V, V2=VP×0.2=6.0V×0.2=1.2V and, therefore, the synthesizing circuit 17 generates V=V1+V2=5.2V. Thus, it is possible to absorb the variation of the operating delay times of the inverter elements.

The synthesizing ratio 1:4 is selected under assumption that the voltage for regulating the characteristics of the inverters 13a of the delay line 13 is about 20% of the voltage of the power source line 14 of the ring oscillator 12 as a reference.

As described, the ratio 1:4 is selected in order to limit the regulation range of the voltage generated by the voltage follower 15a to a range of the comparison result for one period of the external clock CLK. In this case, it is enough to perform a fine regulation in a range wide enough to absorb the characteristics variation of the inverters. Therefore, even if the result of comparison between the output side clock CLK and the input side clock CLK shows a higher or lower voltage in a second and/or third period, it is possible to generate the control voltage, which is not substantially different from the voltage $V_p$ of the power source line 14 of the ring oscillator 12, on the power source line 13b of the inverters 13a by setting the ratio as mentioned.

As described in detail hereinbefore, the inverters are used as elements for constituting the ring oscillator and the delay line. It should be noted that the inverter may include a differential amplifier or an inverting amplifier utilizing an operational amplifier.

In the described embodiments, although the data transfer rate n is 7 times that of the clock, it may be equal to or more than 2 times.

What is claimed is:

1. A sampling clock generator circuit comprising: a ring oscillator including series-connected m first inverters connected to a first power supply line, where m is an odd number equal to or larger than 3; a delay line including series-connected 2m or 2m−1 second inverters connected to a second power supply line, for delaying an externally supplied clock signal; and a PLL circuit including a voltage controlled oscillation circuit for controlling an oscillation frequency of said ring oscillator by controlling a voltage of said first power supply line, a voltage of said second power supply line being set substantially equal to the voltage of said first power supply line and the delayed clock obtained by said second inverters is used as a sampling clock.

2. A sampling clock generator circuit as claimed in claim 1, wherein said first and second power supply lines are directly connected each other and set to substantially an equal voltage, the delayed clocks obtained from said second inverters are used to convert a serially transmitted data into a parallel data.

3. A sampling clock generator circuit as claimed in claim 2, wherein said ring oscillator generates pulses having period substantially equal to a period of the external clock signal and said PLL circuit includes a phase comparator circuit for comparing the phase of the external clock with the phase of the pulses.

4. A sampling clock generator circuit as claimed in claim 3, wherein said external clock signal is transmitted together with the data transmitted serially through a line different from that of the data transmitted serially and the data is serially transmitted at a frequency n times that of the transmitted clock in units of n data, where n is an integer equal to or larger than 2.

5. A sampling clock generator circuit as claimed in claim 4, wherein m is 7 and the external clock signal is serially transmitted from a computer together with the data.

6. A sampling clock generator circuit comprising: a ring oscillator including series-connected m first inverters connected to a first power supply line, where m is an odd number equal to or larger than 3; a delay line including series-connected 2m or 2m−1 second inverters connected to a second power supply line, for delaying an externally supplied clock; a first PLL circuit including a voltage controlled oscillation circuit for controlling an oscillation frequency of said ring oscillator by controlling a voltage of said first power supply line, a second PLL circuit for generating a control voltage for locking the clocks outputted said inverters of said delay line by comparing the phase of the external clock with the phase of the clocks outputted from said delay line; and a voltage setting circuit for setting the voltage of said second power supply line on the basis of the voltage of said first power supply line and the control voltage, the delayed clock obtained from said second inverters is used as a sampling clock.

7. A sampling clock generator circuit as claimed in claim 6, wherein said ring oscillator generates pulses having period substantially equal to a period of the external clock signal, said first PLL circuit includes a first phase comparator circuit for comparing the phase of the external clock signal with the phase of the pulses and said second PLL circuit includes a second phase comparator circuit for comparing the phase of the external clock signal with the phase of the clocks outputted the 2 m-th stage inverter of said delay line.

8. A sampling clock generator circuit as claimed in claim 7, wherein said external clock signal is transmitted together with the data transmitted serially through a line different from that of the data transmitted serially and the data is serially transmitted at a frequency n times that of the transmitted clock signal in units of n data, where n is an integer equal to or larger than 2.

9. A sampling clock generator circuit as claimed in claim 8, wherein m is equal to n, said first PLL circuit includes a first charge pump circuit, a first low-pass filter and a first voltage follower, said first charge pump circuit receives the output of the first phase comparator, an output of the first charge pump circuit is inputted to the first low-pass filter, an output of the first low-pass filter is inputted to the first voltage follower, the output of the first voltage follower is connected to said first power supply line, the said second PLL circuit includes a second charge pump circuit, a second low-pass filter and a second voltage follower, said second charge pump circuit receives the output of the second phase comparator, an output of the second charge pump circuit is inputted to the second low-pass filter, an output of the second low-pass filter is inputted to the second voltage follower and said voltage setting circuit is a synthesizing circuit which synthesizes a voltage signal of the first voltage follower with a voltage of the second voltage follower.

10. A data receiving device comprising: a ring oscillator including series-connected m first inverters connected to a first power supply line, where m is an odd number equal to or larger than 3; a delay line including series-connected 2m or 2m−1 second inverters connected to a second power supply line, for delaying an externally supplied clock and outputting the thus delayed external clock from said second inverters; a PLL circuit including a voltage controlled oscillation circuit for controlling an oscillation frequency of said ring oscillator by controlling a voltage of said first power supply line; and a serial/parallel converter circuit for converting the transmitted serial data into a parallel data in units of n data, said serial/parallel converter circuit being supplied with the delayed clock obtained from said second inverters by setting the voltage of said second power supply line substantially equal to the voltage of said first power supply line.

11. A data receiving device comprising: a ring oscillator including series-connected m first inverters connected to a first power supply line, where m is an odd number equal to or larger than 3; a delay line including series-connected 2m or 2m−1 second inverters connected to a second power supply line, for delaying an externally supplied clock and outputting the thus delayed external clock from said second inverters; a first PLL circuit including a voltage controlled oscillation circuit for controlling an oscillation frequency of said ring oscillator by controlling a voltage of said first power supply line; a second PLL circuit for comparing a phase of the external clock with a phase of the clock outputted from said inverters of said delay line and generating a control voltage for locking the clock outputted from said inverters of said delay line; a voltage setting circuit for setting the voltage of said second power supply line on the basis of the voltage of said first power supply line and the control voltage; and a serial/parallel converter circuit for converting the transmitted serial data into a parallel data in units of n data, said serial/parallel converter circuit being supplied with the delayed clock obtained from said second inverters.

12. A sampling clock generator circuit as claimed in claim 11, wherein said first and second power supply lines are directly connected each other and set to substantially an equal voltage, the delayed clocks obtained from said second inverters are used to convert a serially transmitted data into a parallel data.

* * * * *